United States Patent [19]

Hohider et al.

[11] Patent Number: 5,161,091

[45] Date of Patent: Nov. 3, 1992

[54] PACKAGING UNIT FOR AN ELECTRICAL ASSEMBLY

[75] Inventors: David Hohider, Wooster; Mark A. Cenky, Lexington, both of Ohio

[73] Assignee: Therm-O-Disc, Incorporated, Mansfield, Ohio

[21] Appl. No.: 811,788

[22] Filed: Dec. 20, 1991

[51] Int. Cl.$^5$ .............................................. H05K 7/20
[52] U.S. Cl. ................... 361/386; 361/394; 361/399; 361/419; 361/420; 357/80; 165/66; 165/185; 337/401; 174/16.3
[58] Field of Search ............... 361/380, 386, 388, 392, 361/394, 399, 403, 411, 418, 417, 419, 420; 337/4, 405, 183, 401, 402, 403, 404, 406–409; 174/16.3; 357/80, 81; 165/66, 80.3, 185; 24/455

[56] References Cited
U.S. PATENT DOCUMENTS 4,687,905  8/1987  Cunningham et al. ............. 219/336
4,968,962  11/1990  Hohider et al. ..................... 337/4

Primary Examiner—Leo P. Picard
Assistant Examiner—Young S. Whang
Attorney, Agent, or Firm—Jones, Day, Reavis & Pogue

[57] ABSTRACT

A device for holding a thermal cutoff device and a resistor in assembled relationship to each other in a housing and biasing the thermal cutoff device and the resistor into heat tansfer relationship with each other in the housing. Metal clips are attached to each housing half such that when the housing halves are mated, the clips are in opposing relationship to each other. Arcuate ends are formed on the clip such that when the opposing ones of the clips face each other in the housing, the arcuate ends substantially encircle one-half of the thermal cutoff device. Resilient fingers are formed on the other end of each of the clips such that when the opposing clips face each other, the resilient fingers grasp the resistor and pull it into engagement with the thermal cutout device for heat transfer relationship. The resilient fingers deflect sufficiently to allow resistors of different diameter to be used in the housing.

10 Claims, 1 Drawing Sheet

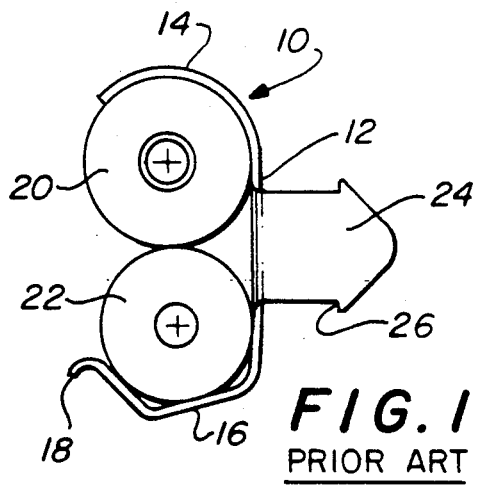
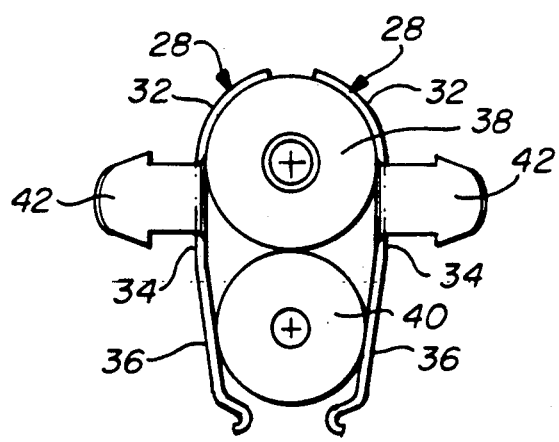
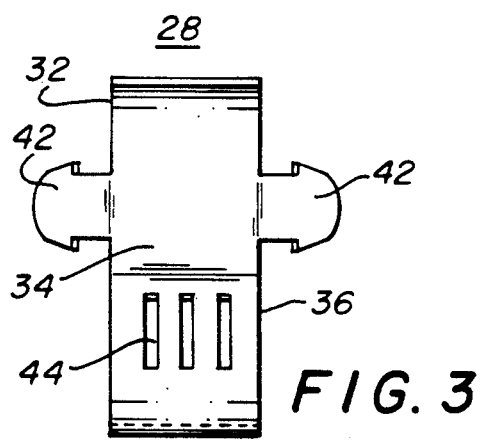
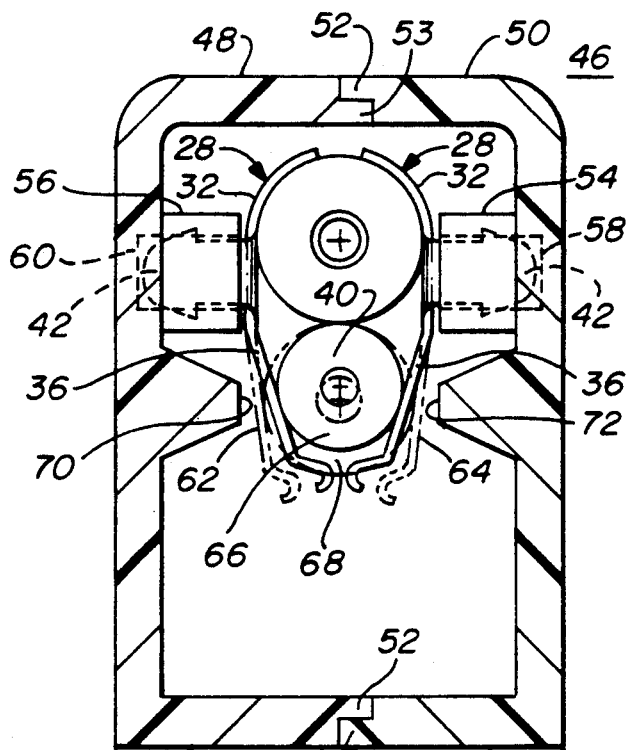
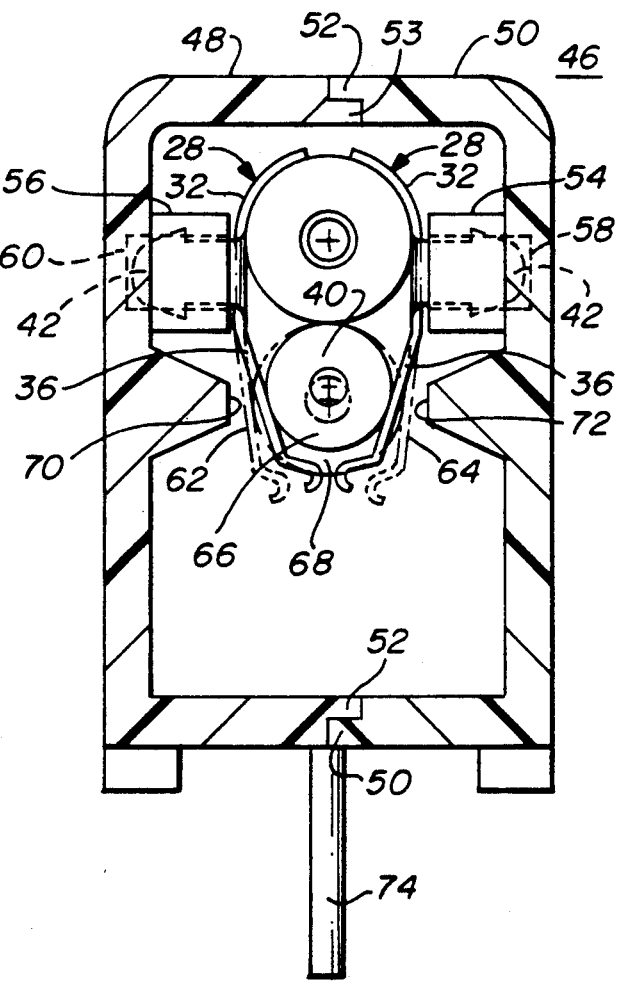
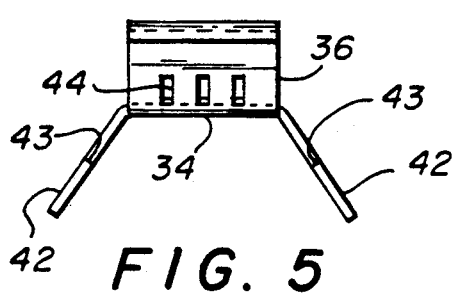

PACKAGING UNIT FOR AN ELECTRICAL ASSEMBLY

FIELD OF THE INVENTION

This application relates to the art of electric circuit component assemblies, and, more particularly, to a packaging assembly of components used for circuit protection. The invention is particularly applicable to packaging assemblies for holding thermal cutoffs and to assembling the same with heating resistors. However, it will be appreciated that certain features of the invention have broader aspects and can be used for other purposes.

BACKGROUND OF THE INVENTION

As disclosed in U.S. Pat. No. 4,968,962, thermal cutoffs are commonly combined with a resistance heater. In the event of a circuit malfunction, the resistance heater is energized for rapidly raising the thermal cutoff to a temperature at which it operates to provide an open circuit. U.S. Pat. No. 4,968,962, which is incorporated herein by reference in its entirety, discloses a simplified manner of mounting a thermal cutoff and for assembling the same in heat transfer relationship with a resistor.

In one arrangement, the thermal cutoff and resistor are held in physical contact one with another by a metal clip. The metal clip is formed preferably of beryllium copper to provide good heat transfer from the resistor to the thermal cutoff. The clip is generally U-shaped in an end view and includes a substantially flat base portion having a pair of curved arms extending therefrom and toward one another. The arms have a curvature that is approximately the same or slightly smaller than the curvature of the bodies of the thermal cutoff and the resistor. The arms terminate in an outwardly curved end portion to facilitate snapping one of the thermal cutoff or resistor elements into the clip once the other is already in position. The distance between the outer arms is preferably less than the combined diameters of the bodies of the thermal cutoff and the resistor. Thus the arms will be under bending stress when the thermal cutoff and resistor are received therein and will bias the thermal cutoff and resistor into firm physical engagement with each other for optimum heat transfer.

While the prior art clip functions well to hold the thermal cutoff in heat transfer relationship with the resistor, it has been found that it can be difficult to "snap" the thermal cutoff and the resistor into the clip.

The present invention overcomes the difficulty of "snapping" the thermal cutoff and the resistor into a clip by using two identical clips when each is mounted in a corresponding one-half of a housing, face each other as the housing is assembled and allows the unit to be assembled without snapping the resistor and the thermal cutoff into position. The opposing clips provide the necessary force to hold the components secure. An arcuate end is formed on the clip such that when opposing ones of the clips face each other in the housing, the arcuate ends substantially encircle one-half of one of the electrical devices, either the resistor or the thermal cutoff device. A resilient finger is formed on the other end of the clip such that when the opposing clips face each other the resilient fingers grasp the other electrical device, the thermal cutoff or the resistor, and pull it into engagement with the first electrical device for heat transfer relationship. The resilient finger deflects to allow electrical devices of different diameter to be used in the housing. In order to increase the ease of deflection of the resilient finger to accommodate various size electrical devices, at least one slot is formed in the resilient finger on the clip. Further, at least one elongated projection is attached to the metal clip for attaching the clip to the housing. Each one-half of the housing has at least one slot formed therein for receiving the corresponding elongated projection on the metal clip such that the elongated projection of each metal clip is inserted in the corresponding slot to attach a clip to each housing half. Also, a raised stop is integrally formed with each housing half such that the stop is in spaced relationship with the resilient finger of an attached clip to limit the amount the resilient finger can deflect, thereby placing a limit on the maximum size of the electrical device to be used in the electrical assembly.

Thus it is an object of the present invention to provide a device for holding a first electrical device and a second electrical device in assembled relationship to each other in a housing and biasing the devices into engagement with each other in the housing. The device is a metal clip which has one arcuate end such that when opposing ones of the clips face each other in the housing, the arcuate ends substantially encircle one-half of one of the electrical devices such as the thermal cutoff device. A resilient finger is formed on the other end of the clip such that when opposing clips face each other, the resilient fingers grasp the other electrical device such as a resistor and pull it into engagement with the thermal cutoff device for heat transfer relationship. The resilient fingers deflect to allow electrical devices of different diameter to be used in the housing.

It is also an object of the present invention to increase the ease of deflection of the resilient finger to accommodate the various size electrical devices by forming at least one slot in the resilient finger.

It is also an object of the present invention to provide at least one elongated projection attached to the metal clip for attaching the clip to the housing.

It is still another object of the present invention to provide a raised stop integrally formed with each housing half such that the stop is in spaced relationship with the resilient finger of the attached clip to limit the amount the resilient finger can deflect, thereby placing a limit on the maximum size of the electrical device to be used in the electrical assembly.

It is still another object of the present invention to provide opposing clips in a housing, to provide the necessary force to hold components in a secure manner without requiring the components to be snapped into position in the clips.

SUMMARY OF THE INVENTION

Thus the present invention relates to a device for holding a first electrical component and a second electrical component in assembled relationship to each other in a housing and biasing the components into engagement with each other in the housing and comprising a metal clip, an arcuate end formed on the clip such that when opposing ones of the clips face each other in the housing, the arcuate ends substantially encircle one-half of one of the electrical components, and a resilient finger on the other end of the clip such that when opposing clips face each other, the resilient fingers grasp the other electrical device and pull it into engagement with the first electrical component for heat transfer relationship, the resilient fingers deflecting to allow electrical components of different diameter to be used in the housing.

The invention also relates to a packaging unit for an electrical assembly including first and second electrical components in heat transfer relationship, the components having leads projecting therefrom and the unit comprising first and second halves of a housing attached to each other for containing the electrical assembly with the components in heat transfer relationship, a metal clip attached to each housing half and facing each other when the housing halves are assembled, a first portion of the clip engaging one of the electrical components, and a second portion of the clip engaging the other of the electrical components when the housing halves are assembled to hold the first and second components in heat transfer relationship, and means for snapping the two halves together in a locking relationship with the leads of the first and second components projecting therefrom for attachment to an electrical circuit.

BRIEF DESCRIPTION OF THE DRAWINGS

These and other objects of the present invention will be more fully understood when taken in conjunction with the following detailed description and the drawings in which like numerals represent like components and in which:

FIG. 1 is an end view of a prior art clip for holding first and second electrical components in heat transfer relationship;

FIG. 2 is an end view of the present invention that utilizes first and second clips in opposed facing relationship to hold the two electrical components in heat transfer relationship with each other;

FIG. 3 is a plan view of one of the novel clip assemblies;

FIG. 4 is a side view of the novel clip assembly illustrated in FIG. 3;

FIG. 5 is a bottom view of the novel clip assembly illustrated in FIG. 3; and

FIG. 6 is a cross-sectional view of a packaging unit comprising two housing halves, each of which has a novel clip of the present invention attached thereto in such a way that when the two halves are assembled as shown, the opposed clips encircle and contain the electrical components in heat transfer relationship.

DETAILED DESCRIPTION OF THE DRAWINGS

FIG. 1 is an end view of a prior art clip 10 that holds a thermal cutoff device 20 and a resistor 22 in heat transfer relationship. The clip 10 includes an upper arcuate portion 14 that substantially encircles the upper portion of the thermal cutoff device 20. It has a spring-type elongated finger 16 that passes under the resistor 22 and a curved outer end portion 18 which is used to press down finger 16 to disengage the clip 10 from the thermal cutoff device 20 and the resistor 22. A projection 24 extends outwardly from each side of the clip 10 to engage a corresponding slot in the housing in which it is located. The projection 24 has hooks 26 in the shape of a ledge thereon to engage the slot in the housing so as to hold the clip securely fastened to the housing. This clip functions well but it is difficult to insert both of the components 20 and 22 therein simply by snapping them into the clip 10. The lower finger 16 must be moved down a great extent in order to create sufficient space to receive the resistor 22. Depending upon the stiffness of the metal forming the clip 10, this can be a difficult process.

FIG. 2 is an end view of the dual clip system of the present invention. The thermal cutoff device 38 and the resistor 40 are held in heat transfer relationship by a pair of identical but opposing clips 28 that face each other. One of the clips 28 is attached by a projection 42 to one housing half while the other clip 28 is attached by its projection 42 to the other housing half in the same manner described previously. When the housing halves are mated, as will be shown hereafter in relation to FIG. 6, the thermal cutoff device 38 and the resistor 40 are held in heat transfer relationship with each other as illustrated in FIG. 2. Each of the metal clips 28 comprises an upper arcuate section 32 such that when opposing ones of the clips face each other in the housing, as illustrated in FIG. 2, the arcuate ends substantially encircle one-half of the thermal cutoff device. The resilient fingers 36 extend downwardly at an angle inwardly from the center portion 34 of the clip 28. Thus when the opposing clips face each other as illustrated in FIG. 2, the resilient fingers 36 grasp the resistor 40 and pull it into engagement with the thermal cutoff device 38 for heat transfer relationship. The fingers 36 are resilient in order to allow resistors of different diameters to be used in the housing.

FIG. 3 is a plan view of one of the proposed clips 28 illustrating the upper arcuate portion 32, the center portion 34, and the resilient finger 36. Two projections 42, one extending from each side, are utilized to attach the metal clip 28 to the housing. At least one slot 44 is formed in the resilient finger 36 to increase the ease of deflection of the finger 36 to accommodate the various size resistors that might be used in conjunction with the thermal cutoff device. Three of such slots are illustrated in FIG. 3 and FIG. 5 and as many slots may be used as necessary to provide the proper resiliency of the finger 36.

FIG. 4 is a side view of one of the novel clips as shown in FIG. 3 and FIG. 5 is a bottom view. The elongated projections 42 are shown extending outwardly at an angle but when placed in the housing, are pressed inwardly toward each other until they are in a plane substantially perpendicular to the plane of the clip and parallel to the plane of the corresponding slot. They are then inserted in the corresponding slots in the housing.

FIG. 6 is a cross-sectional view of a housing 46 illustrating the present invention. The housing 46 is formed of two halves 48 and 50. They may be entirely symmetrical if desired and attached to each other as discussed in commonly assigned, copending U S. application Ser. No. 811,701 incorporated herein by reference in its entirety; however, they are shown in FIG. 6 as having an outwardly extending lip 52 which fits over a shoulder 53 in a mating relationship on both the top and the bottom of the housing 46. In such case, of course, there is a right housing half and a left housing half which must be mated. As can be seen in FIG. 6, one of the clips 28 has its elongated projection 42 inserted in a slot 58 of the housing half 50. The other clip 28 has its elongated projection 42 inserted in a slot 60 in housing half 48 to securely hold the clip. With one half 48 of the housing 46 lying on its side with the clip 28 facing outwardly, the thermal cutoff device 38 and resistor 40 are simply placed on the clip 28. When the other half of the housing 50 is placed on top of the housing half 48, the two clips 28 oppose each other and simply by forcing the two halves 48 and 50 together, the resilient fingers 36 move outwardly to accommodate the resistor 40 and pull it into heat transfer relationship with the thermal cutoff device 38. The resilient fingers 36 can move further outwardly from the positions shown to the positions 62 and 64 illustrated in phantom lines to accommodate larger size resistors 40. Because of the slots 44 shown in FIG. 3 that are formed in the resilient fingers 36, they can deflect from a minimum resistor diameter as illustrated by circle 66 to a maximum diameter resistor as illustrated by circle 68. Raised stops 70 and 72 are integrally formed with each housing half 48 and 50, respectively, such that the stops 70 and 72 are in spaced relationship with the corresponding resilient finger 36 of the attached clip 28 to limit the amount the resilient finger can deflect, thereby placing a limit on the maximum size of the electrical resistor to be used in the electrical assembly.

Thus the present invention is an improvement over the invention disclosed in the commonly assigned co-pending application Ser. No. 811,701 filed Dec. 20, 1991 and entitled "Packaging Assembly", and incorporated by reference herein in its entirety, in that the commonly assigned co-pending application Ser. No. 811,701 utilizes the clip of the prior art which makes it difficult to insert the resistor and thermal cutoff device in the clip. The novel clip of the present invention can be used with the housing assembly of the commonly assigned co-pending application Ser. No. 811,701.

Thus there has been disclosed a novel clip and housing assembly for holding a thermal cutoff device and a resistor in assembled relationship to each other in a housing and biasing the thermal cutoff device and the resistor into engagement with each other in the housing. The invention comprises a metal clip having an arcuate end formed thereon such that when opposing ones of the clips face each other in the housing, the arcuate ends substantially encircle one-half of the thermal cutoff device. A resilient finger is formed on the other end of the clip such that when the opposing clips face each other, the resilient fingers grasp the resistor and pull it into engagement with the thermal cutoff device for heat transfer relationship. The resilient fingers deflect sufficiently to allow electrical devices, such as resistors, of different diameter to be used in the housing.

To increase the ease of deflection of the resilient fingers to accommodate various size resistors, at least one slot is formed in the resilient fingers. The number of slots in the fingers is determined by the amount of resiliency required.

The novel invention also relates to a packaging unit for an electrical assembly including first and second electrical devices such as a thermal cutoff device and a resistor in heat transfer relationship. The thermal cutoff device and the resistor have electrical leads projecting therefrom. The housing comprises first and second halves attached to each other for containing the electrical assembly with the devices in heat transfer relationship. Also a metal clip is attached to each housing half facing each other when the housing halves are assembled. A first portion of the clips engage one of the electrical devices and a second portion of the clips engage the other of the electrical devices such that when the housing halves are assembled the first and second electrical devices are held in heat transfer relationship. As shown in commonly assigned co-pending application Ser. No. 811,701 filed Dec. 20, 1991 and entitled "Packaging Assembly," and incorporated herein by reference in its entirety, the ends of each packaging half or housing half are so constructed that the two halves can be snapped together in a locking relationship with the leads of the thermal cutoff device and the resistor projecting therefrom for attachment to an electrical circuit.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

We claim:

1. A device for holding a first electrical device and a second electrical device in assembled relationship to each other in a housing and biasing the devices into engagement with each other in the housing and comprising:
   first and second metal clips in opposing relationship in the housing;
   an arcuate end formed on each opposed metal clip such that opposing arcuate ends substantially encircle one-half of one of the electrical devices; and
   a resilient finger on the other end of each clip such that opposing resilient grasp the other electrical device and pull it into engagement with the first electrical device for heat transfer relationship, the resilient fingers deflecting to allow electrical devices of different diameters to be used in the housing.

2. A device as in claim 1 further including at least one slot formed in the resilient finger to increase the ease of deflection to accommodate various sized electrical devices.

3. A device as in claim 2 further comprising:
   at least one elongated projection attached to each metal clip for attaching the metal clip to the housing.

4. A device as in claim 1 wherein:
   said first electrical device is a thermal cutoff device; and
   said second electrical device is a resistor held in contact with the thermal cutoff device in heat transfer relationship.

5. A packaging unit for an electrical assembly including first and second electrical devices in heat transfer relationship, said devices having electrical leads projecting therefrom and from said unit, said unit comprising:
   first and second halves of a housing attached to each other for containing the electrical assembly with the devices in heat transfer relationship;
   a metal clip attached to each housing half and opposing the corresponding metal clip when the housing halves are assembled;
   a first portion of opposed clips engaging one of the electrical devices;
   a second portion of opposed clips engaging the other of said electrical devices when the housing halves are assembled to hold the first and second devices in heat transfer relationship; and
   means for snapping the two halves together in a locking relationship with the leads of the first and second devices projecting therefrom for attachment to an electrical circuit.

6. A unit as in claim 5 further including:
   electrical devices that are substantially cylindrical in shape;

an arcuate end on each metal clip such that when opposing ones of the metal clips face each other in the housing, the opposing arcuate ends encircle a portion of a first one of the electrical devices; and an elongated finger on the other end of each of the metal clips such that when the opposing clips face each other, opposing fingers face each other to deflect and grasp the other one of the electrical devices and pull it into engagement with the first one of the electrical devices for heat transfer relationship.

7. A unit as in claim 6 wherein each of the elongated fingers are of resilient spring material.

8. A unit as in claim 7 further including at least one elongated slot in each resilient finger to increase the deflection capability of the resilient finger and allow electrical devices of different diameter to be used in the housing.

9. A unit as in claim 8 further comprising:

at least one slot formed in each half of the housing and at least one corresponding elongated projection on each metal clip such that the elongated projection of each metal clip is inserted in the corresponding slot in each housing half to attach the metal clip to each housing half.

10. A unit as in claim 9 further including a raised stop integrally formed with each housing half such that the stop is in spaced relationship with the resilient finger of the attached clip to limit the amount the resilient finger can deflect so as to place a limit on the maximum size of the other one of the electrical devices to be used in the electrical assembly.

* * * * *